United States Patent [19]
Blakely et al.

[11] Patent Number: 5,910,339
[45] Date of Patent: Jun. 8, 1999

[54] FABRICATION OF ATOMIC STEP-FREE SURFACES

[75] Inventors: Jack M. Blakely, Ithaca, N.Y.; So Tanaka, Osaka, Japan; Christopher C. Umbach, Aurora; Rudolf M. Tromp, North Salem, both of N.Y.

[73] Assignees: Cornell Research Foundation, Inc., Ithaca; International Business Machines, Corp., Armonk, both of N.Y.

[21] Appl. No.: 08/697,315

[22] Filed: Aug. 22, 1996

[51] Int. Cl.$^6$ ........................................................ B05D 3/02
[52] U.S. Cl. .................................. 427/376.2; 427/372.2; 427/397.7; 427/551; 427/596; 216/79; 438/402; 438/412; 438/471; 438/697; 438/698; 438/719; 438/759; 438/760; 438/795
[58] Field of Search .................................. 438/402, 412, 438/471, 795, 759, 760, 764, 697, 698, 719; 427/372.2, 376.2, 397.7, 555, 559, 551, 596; 216/63, 79

[56] References Cited

U.S. PATENT DOCUMENTS

| | | | |
|---|---|---|---|
| 2,953,486 | 9/1960 | Atalla | 438/770 |
| 3,085,033 | 4/1963 | Handelman | 438/770 |
| 3,793,090 | 2/1974 | Barile et al. | 438/591 |
| 3,923,559 | 12/1975 | Sinha | 438/12 |
| 4,151,007 | 4/1979 | Levinstein et al. | 438/657 |
| 4,154,873 | 5/1979 | Hickox et al. | 438/770 |
| 4,659,392 | 4/1987 | Vasudev | 438/412 |
| 4,866,009 | 9/1989 | Matsuda | 437/471 |
| 4,878,988 | 11/1989 | Hall et al. | 438/471 |
| 4,933,298 | 6/1990 | Hasegawa | 438/150 |
| 5,028,564 | 7/1991 | Chang et al. | 438/412 |
| 5,244,819 | 9/1993 | Yue | 438/402 |
| 5,275,687 | 1/1994 | Choquette et al. | 117/98 |
| 5,279,687 | 1/1994 | Tuppen et al. | 148/33.2 |
| 5,393,686 | 2/1995 | Yeh et al. | 438/264 |
| 5,445,975 | 8/1995 | Gardner et al. | 438/449 |
| 5,478,762 | 12/1995 | Chao | 438/143 |

OTHER PUBLICATIONS

Keefe, Mary E. et al., "Surface self–Diffusion on Si From the Evolution of Periodic Atomic Step Arrays", J. Phys. Chem. Solids, vol. 00, pp. 1–9, 1994.

Bartelt, N.C. et al., Step Capillary Waves and Equilibrium Island on Si(001), The American Physical Society, vol. 73, No. 12, pp. 1656–1659, Sep. 19, 1994.

Homma, Yoshikazu et al., "Ultra–Large–Scale Step–Free Terraces Formed at the Bottom of Craters on Vicinal Si(111) Surfaces", Jpn. J. App. Phys., vol. 35 (1996) Pt. 2, No. 2B, pp. L241–243.

*Primary Examiner*—Bernard Codd
*Attorney, Agent, or Firm*—Jones, Tullar & Cooper, PC

[57] ABSTRACT

Fabrication of atomic step-free regions on a substrate surface is achieved by first forming a two-dimensional pattern on the substrate. The pattern is preferably a grating comprising an array of troughs or mesas which are separated from one another by a plurality of ridges or trenches. Any atomic steps on the flat top surfaces of the troughs or mesas are moved into barrier regions formed by the ridge or trench sidewalls during a high temperature annealing or deposition step, thereby leaving the flat surfaces of the troughs and mesas free of atomic steps. Structures having step-free regions large enough to accommodate micron sized devices having nanometer sized features are thereby formed.

8 Claims, 5 Drawing Sheets

FABRICATION OF ATOMIC STEP-FREE SURFACES

BACKGROUND OF THE INVENTION

The present invention relates in general to fabrication of surfaces which are free of atomic steps to facilitate formation of submicron sized devices thereon.

Surface roughness of Si and other semiconductor wafer materials becomes increasingly important as characteristic dimensions of devices, such as FET's, optical devices and layered quantum well structures, are decreased. For example, individual atomic steps or bunches of steps on a wafer surface can have a significant effect on the local field, channel mobility and breakdown characteristics of devices having gate oxide thicknesses in the nanometer range. To avoid this problem, an atomic step-free region having lateral dimensions on the order of one micron is required to accommodate a typical device. Unfortunately, this requires an accuracy in orientation of better than 0.01° over the entire wafer area; locating these regions would be a formidable task. Although high temperature annealing of nominally flat wafers can be used to reduce the root mean square roughness, in general it is impossible to insure entirely step-free regions at the desired locations of individual device structures. Previous work on clean Si(001) has indicated that at miscut angles below 0.03°, atomic steps may even be spontaneously generated to create "hill and valley" structures.

SUMMARY OF THE INVENTION

To address the foregoing problems, the present invention provides a method for the production of extensive step-free regions on wafer or substrate surfaces through formation of special topographical features where the atomic steps can be accumulated and localized. The key to the method is the creation of two dimensional patterns on the wafer surface, wherein arrays of closed barriers are provided at which the atomic steps can accumulate when they become mobile at high temperatures due to deposition or evaporation.

First, a wafer surface is patterned, using conventional lithography and etching techniques, with a plurality of flat surfaced device sized regions, each of which is surrounded by a barrier structure or region. As an example, a plurality of troughs can be formed in the wafer, each of which is surrounded by a plurality of ridges, wherein the flat top surfaces of the troughs form the device regions and the surrounding sidewalls of the ridges form the barrier regions.

Initially, numerous atomic steps would be present on the surfaces of the device regions. To eliminate these, the wafers are subjected to a surface treatment which causes the atomic steps to move into and accumulate in the barrier regions, thereby leaving the surfaces of the device regions step-free. The surface treatment can be carried out using high temperature annealing, etching solution or material deposition, depending upon the patterns employed.

BRIEF DESCRIPTION OF THE DRAWINGS

The features and advantages of the present invention will become apparent from the following detailed description of a number of preferred embodiments thereof, taken in conjunction with the accompanying drawings in which:

FIG. 2B showing a portion of the wafer surface after initial flashing at 1250° C.; FIG. 2C illustrating a similar region of the wafer after Si deposition and annealing for 45 minutes at 1150° C.; and FIG. 2D illustrating the wafer surface region after an additional anneal at 1150° C. for 30 minutes.

DETAILED DESCRIPTION OF THE PREFERRED EMBODIMENTS

A number of experiments were conducted to test the method of the present invention. In these experiments, 3 inch diameter Si(001) wafers (5–10 $\Omega$-cm, B-doped) were employed in which a plurality of approximately 3×3 mm$^2$ two-dimensional areas were patterned using conventional optical or e-beam lithography and reactive ion etching techniques.

Figure 1A:
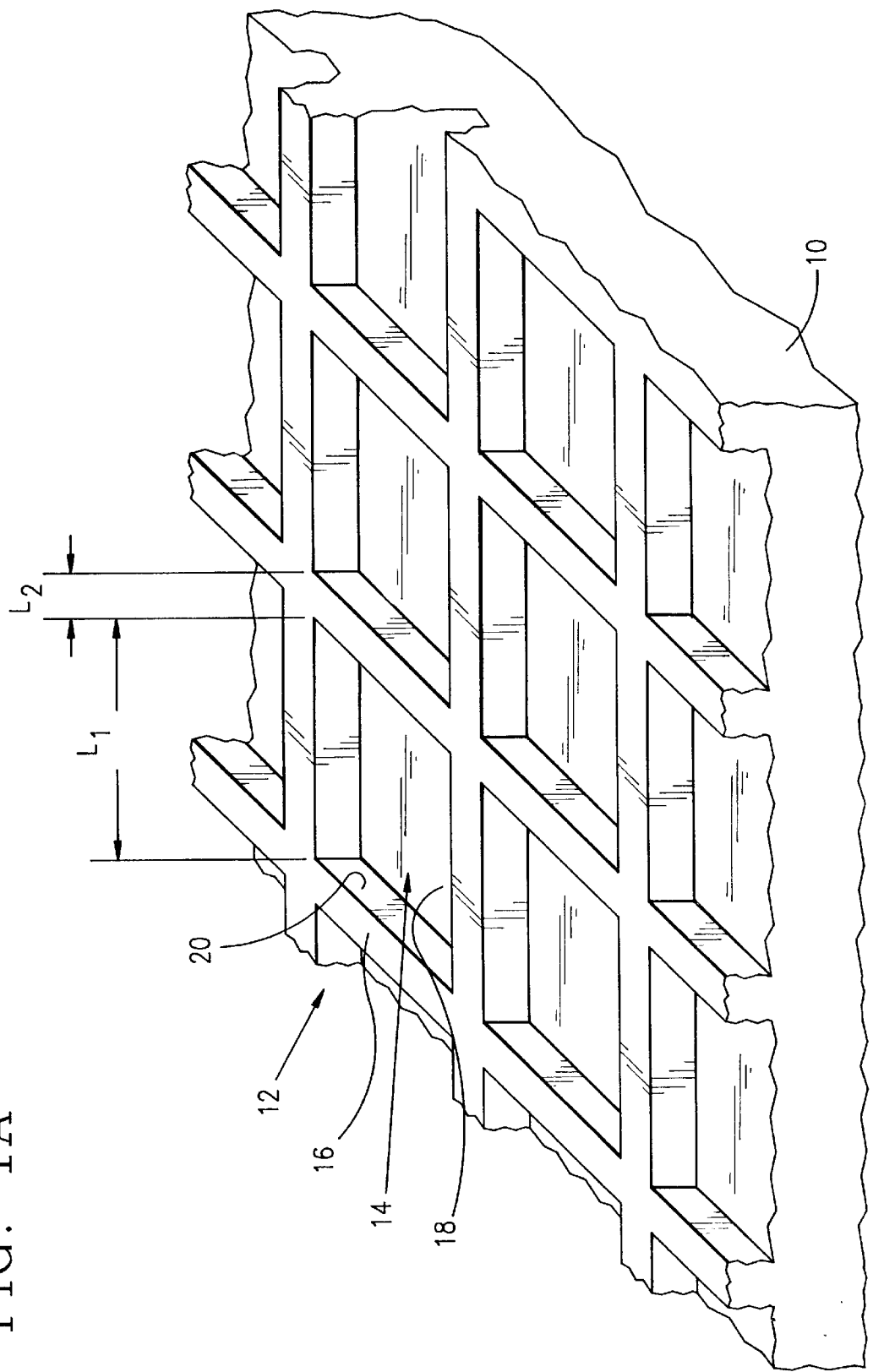
FIG. 1A is a diagrammatic perspective illustration of a patterned wafer surface for implementing the method of the present invention in accordance with a first preferred embodiment thereof.
Figure 1B:
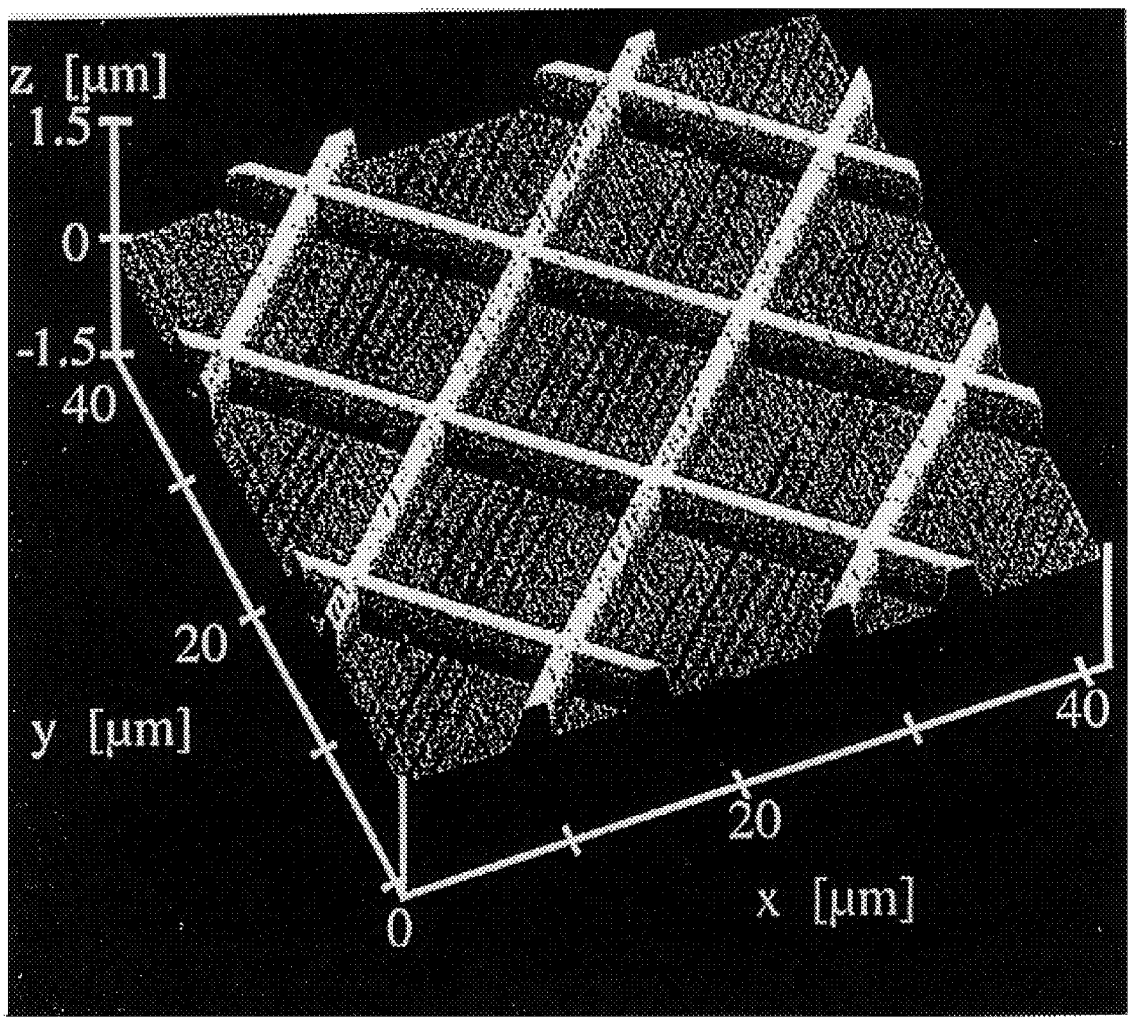
FIG. 1B is an atomic force microscopy (AFM) image of the structure of FIG. 1A prior to being treated in accordance with the method of the present invention to remove atomic steps.

FIG. 1A and the AFM image of FIG. 1B illustrate a patterned wafer structure which was employed in experiments on a first preferred embodiment of the present invention. Referencing FIG. 1A, a Si(001) wafer 10 is illustrated on which a two-dimensional grating 12 has been formed using a conventional lithography and etching technique. The grating 12 is comprised of an array of square troughs 14 which, in the example shown, have a side length, L1, of approximately 15 $\mu$m. These are separated from one another by a plurality of ridges 16, each having a width, L2, of approximately 1 $\mu$m. Each of the troughs 14 includes a flat top surface 18 which is surrounded on all sides by a plurality of ridge sidewalls 20, each of which has a height of approximately 0.5 $\mu$m. The ridge sidewalls 20 therefore act as barrier regions into which atomic steps can be moved or collected from the flat top surfaces 18 using the method of the present invention as described in detail below. The repeat spacing and aspect ratio (height/width) of the ridges 16 can be adjusted as desired or necessary through the e-beam lithography and reactive ion etching processes. The aspect ratio of the ridges 16 may be of importance in determining the morphological stability of the structures upon subsequent annealing as described below.

The flat top surfaces 18 of the troughs 14 are intended to be used for the formation of submicron devices, and therefore must be free of any atomic steps. Thus, any atomic steps on the top surfaces 18 must be moved into the ridge sidewalls 20. This is preferably accomplished once the grating 12 has been formed, by annealing the Si(001) wafer 10 in ultrahigh vacuum (UHV). Before annealing, the wafer 10 was cleaned using an Ishizaka-Shiraki etch treatment, and the resulting oxide layer was removed by flashing to 1250° C. using electron bombardment on the back surface of the wafer 10.

It should be noted that the AFM profiles of the wafer's surface reveal the general shape of the surface, but the resolution is not sufficient in the AFM images to detect individual atomic steps. To observe individual atomic steps on the surface of the wafer 10, Low Energy Electron Microscopy (LEEM) was therefore employed. Individual atomic steps can be observed over relatively large sample areas using LEEM providing their lateral separation is sufficiently large. In the LEEM system used here, the lateral resolution for atomic steps is approximately 10 nm. It should be noted that the Si(001) surface is particularly well suited for an LEEM study of atomic step arrays because it undergoes a surface reconstruction to produce terraces that are either 2×1 or 1×2 structures relative to the ideal (001). At small step densities, the 2×1 and 1×2 regions alternate from one atomic terrace to the next so that, in LEEM, strong contrast can be obtained across the steps by dark field imaging with a (1/2, 0) diffracted beam. Alternating terraces change contrast from black to white and vice versa.

Figure 2A:
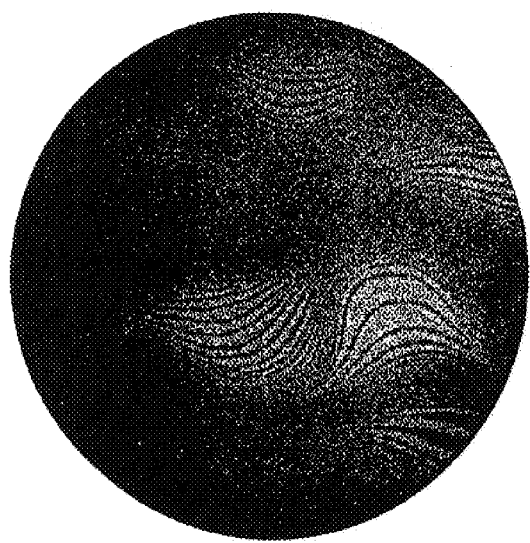
FIGS. 2A–D are low energy electron microscopy (LEEM) images of a Si(001) wafer surface during various steps of the method of the present invention, with FIG. 2A illustrating an unpatterned region of the wafer.

FIGS. 2A–D show a series of LEEM images. FIG. 2A was obtained following the 1250° C. flash from a region removed from the patterned area of the wafer 10. As can be seen, there are numerous atomic steps and in fact, represented by the curved dark lines in the image, and in fact, the step arrangement is not, on the average, changed much by the subsequent treatment. It appears that the wafer "miscut" from (001) is rather large, approximately 0.5°. Although the process was successful, it would have been much easier to implement with more accurately oriented wafers; such wafers are available.

Figure 2B:
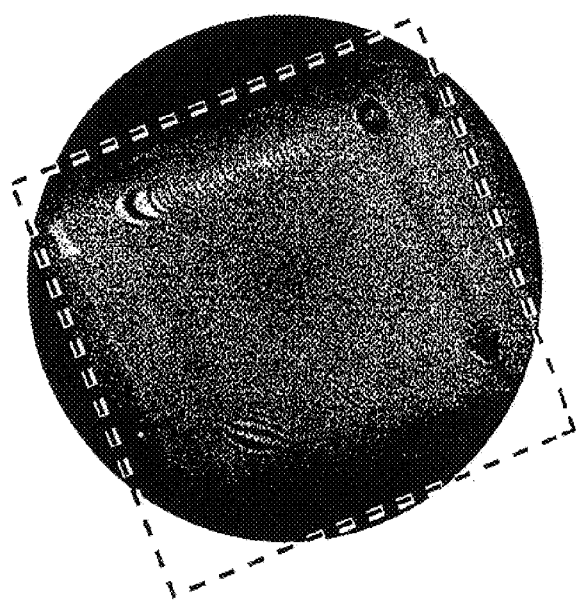

FIG. 2B is an LEEM image of a 6 $\mu$m trough area, also following the 1250° C. flash. The dashed lines in FIG. 2B illustrate the positions of ridges surrounding the trough (these are also represented by the arrows in FIGS. 2C and 2D). Numerous "background" steps are again visible, and there are also morphological features, reproduced from one trough to another, probably due to the ion etching process. Along the sides of the ridges there are depressed areas. The troughs are actually bounded by depressed regions next to the ridges, with particularly deep depressions in the corners. Saddle point features are also visible in FIG. 2B. At this stage of the experiment, Si was deposited onto the entire wafer surface from decomposition of disilane (~5×10$^{-7}$ torr at 850° C. for 16 hr.) to diminish these etching features. It should be noted that this deposition step can probably be avoided completely with appropriate changes in the ion etching parameters.

Figure 2C:
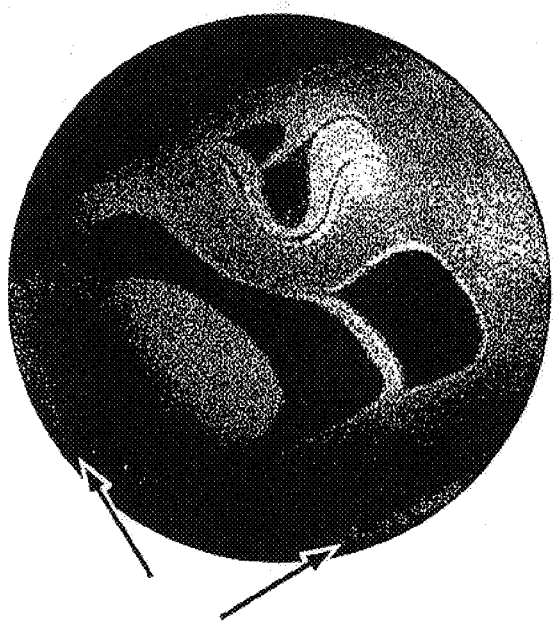
Figure 2D:
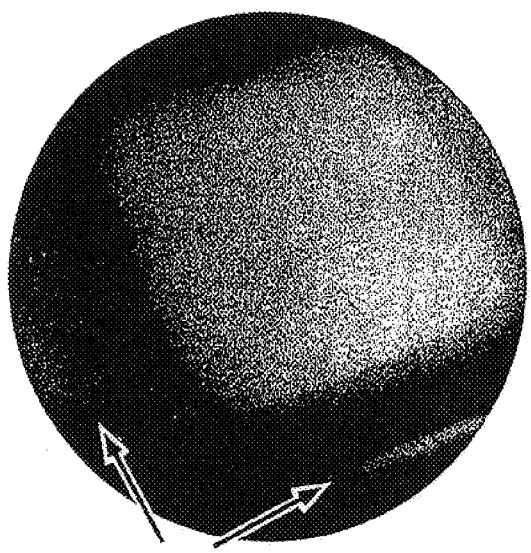

FIG. 2C shows the step distribution on a 6 $\mu$m trough region following an anneal at 1150° C. for 45 min. At this stage, large step-free terraces represented by the dark and light areas in the image have been generated, but there are still some remaining steps. Finally, after a further anneal at 1150° C. for 30 min., the steps are no longer visible and a light colored step-free terrace of approximately 5.5 $\mu$m in extent is produced as illustrated in FIG. 2D. The maximum terrace size that was achieved in these experiments is approximately 10 $\mu$m following an anneal for approximately 12 hr. at 1020–1150° C., although it is expected that the annealing time required to achieve this result could be substantially reduced with more accurately oriented wafers.

The mechanisms by which the atomic steps are eliminated from the trough regions of the structures discussed here are not completely understood at this time. The description of the shapes and how they are attained involves consideration of atomic diffusion on terraces, kinetics of attachment and detachment from steps, two- and three-dimensional evaporation, as well as step interaction mechanisms. Briefly, it is believed that the initial flash to approximately 1250° C. serves to remove the oxide and other impurities. The Si deposition acts to fill in, by a step-flow mechanism the major depressions of the troughs. The high temperature anneals allow the remaining steps to expand to the barrier regions through the mechanism of step-edge evaporation. It should be noted, however, that after very long anneals, the height of the intervening ridges become sufficiently reduced and they no longer serve as effective barriers for the motion of the evaporating edges. As a result, the expanding steps eventually breach the barrier regions if the annealing step continues for too long a time.

The importance of using two-dimensional, rather than one-dimensional, patterning for the starting structure should be emphasized. Although it has been established in previous studies that one-dimensionally periodic Si structures do develop "flat" regions near the crests and valleys, these never become free of the "background" steps due to the wafer miscut. There is, in that case, no barrier to the flow of the steps along the crests and valleys.

The temperature range in which the step elimination anneals are carried out is also important. At temperatures below approximately 1000° C., the rate of evaporation is no longer sufficiently large to counteract the tendency of the system to approach equilibrium through surface diffusive transport. At temperatures above approximately 1150° C., atomic steps are created spontaneously around vacancy islands on the terrace regions, and above approximately 1200° C., the Si surface is substantially roughened.

If the method of the present invention were to be used as the basis of special wafer processing, the question naturally arises as to the effect that the initial ridge structure would have on the various stages of device fabrication and interconnects. The annealed structures described here deviate from (001) in the ridge regions by only a few degrees, and this should not present a major problem in subsequent implantation, oxidation or deposition stages. The initial ridges should be of the smallest height that will still produce effective barriers to step flow. With such ridges, the ion etching inhomogeneities illustrated in FIG. 2B would be minimized, and the deposition stage could probably be eliminated.

Figure 3:
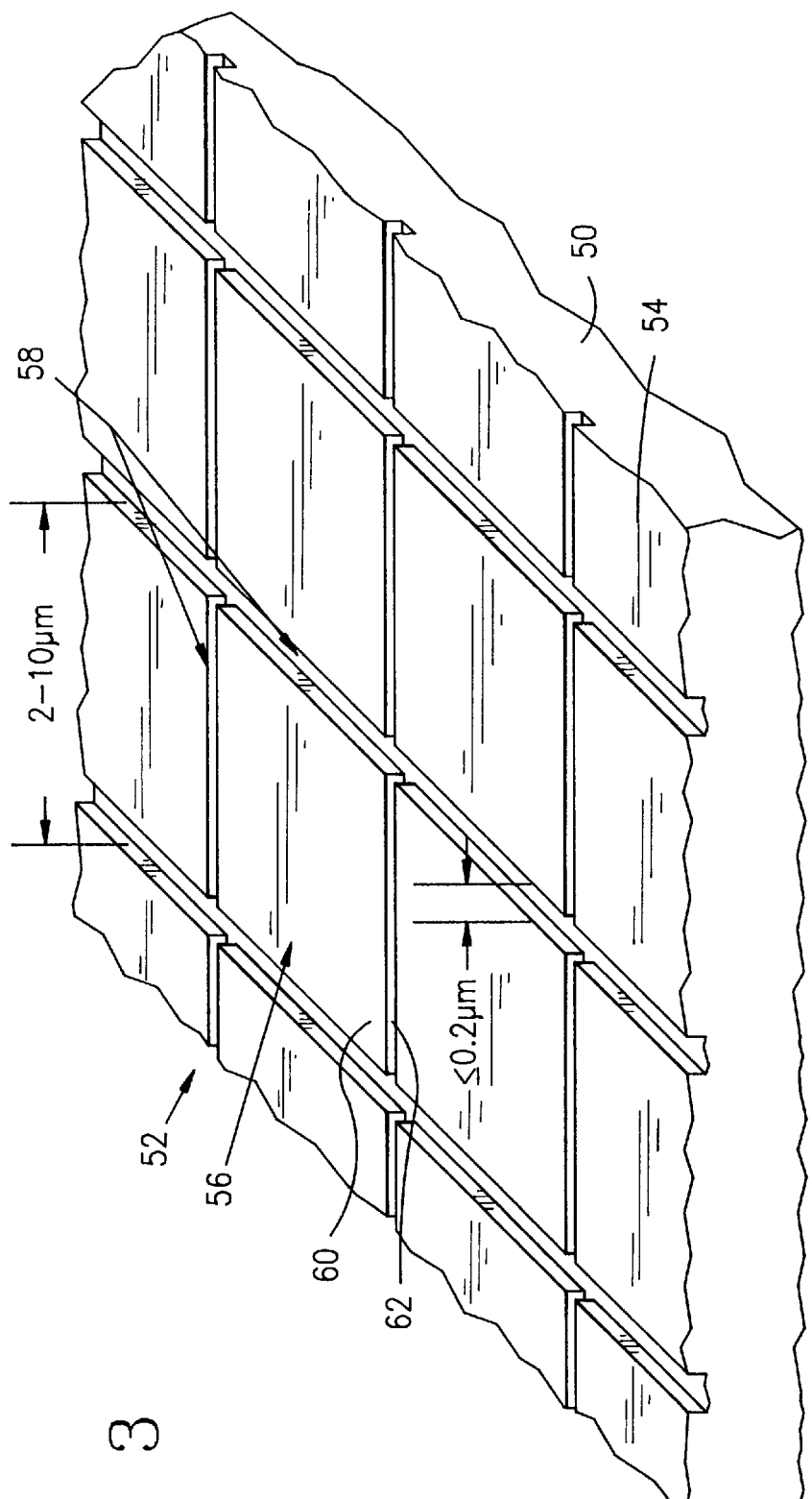
FIG. 3 is a diagrammatic perspective illustration of another type of patterned wafer for implementing the method of the present invention in accordance with a second preferred embodiment thereof.

It should be noted that the starting geometry of the two-dimensional pattern can be varied in order to optimize the fractional area of step-free wafer surface. As an example, FIG. 3 illustrates another wafer pattern which can be employed for formation of an array of step-free areas on a semiconductor or other material wafer. In FIG. 3, an Si(001) wafer 50 is illustrated having a grating 52 formed on a top surface 54 thereof that is comprised of an array of large (approximately 2–10 $\mu$m diameter) square mesas or terraces 56, each of which is separated by a very narrow (less than or equal to approximately 0.2 $\mu$m) trench 58. Each of the mesas or terraces 56 includes a flat top surface 60 and a plurality of vertical sidewalls 62 which form an interface between the top surfaces 60 and the trenches 58.

As in the first embodiment, any atomic steps on the top surfaces 60 will move into the sidewalls 62 during an appropriate treatment step. However, the annealing process employed with the first embodiment will not work with this embodiment. This is because the atomic steps formed on the mesas 56 are of opposite sign (down versus up) to the steps which are formed on the troughs 14 in the first embodiment. This means that the center area of each of the trough top surfaces 18 is lower than the surrounding area, and is bounded by "steps-up" which can be evaporated outwardly into the ridge sidewalls 20 with the annealing process. In contrast, the mesa top surfaces 54 of the second embodiment each have a centrally located high point which is surrounded by "steps-down". To eliminate these steps, an Si deposition process must be employed in place of the annealing process to move these steps outwardly into the mesa sidewalls 62.

It should also be pointed out that although the patterns employed in each of the foregoing embodiments are periodic in nature, the method of the present invention is not limited to these types of patterns. Alternatively, each of the patterns could be comprised of a number of different sized flat step-free areas for accommodating different sizes of active devices on the same wafer. The use of vertical sidewalls for the barrier regions is also not required. Any structure having a vertical component, such as a sloped sidewall, will also suffice. In addition, it is envisioned that the high temperature annealing step employed in the first embodiment could be replaced using either a controlled solution-etching method or electromigration enhanced step flow. Evaporation promoting agents, such as $O_2$, may also be used to further improve the temperature range and control of the preparation for the process. Finally, although each of the embodiments have been specifically disclosed for use with Si(001) wafers, the method of the present invention could be employed for forming step-free regions not only on any other type of semiconductor substrate, but also on other types of material substrates, such as for example, metals and ceramic materials.

Although the present invention has been disclosed in terms of a number preferred embodiments and variations thereon, it will be understood that numerous additional modifications and variations could be made thereto without departing from the scope of the invention as defined in the following claims.

What is claimed is:

1. A method for forming atomic step-free regions on a wafer surface comprising the steps of:

a) providing a wafer having a top surface;
   b) forming a two-dimensional grating on said surface comprising a plurality of flat surfaced troughs and a plurality of upstanding ridges disposed on said surface in the shape of a two-dimensional grating pattern, each of said troughs being surrounded by a corresponding plurality of said ridges, and being separated from each adjacent one of said troughs by a corresponding one of said ridges, each of said ridges having at least a first sidewall which acts as a barrier region;
   c) removing an oxide layer on each of said troughs; and
   d) moving atomic steps on said flat surfaced troughs into said barrier regions of said ridges by annealing said top surface of said wafer.

2. The method of claim 1, wherein said step of providing a wafer comprises providing a wafer formed of Si (001).

3. The method of claim 2, wherein said annealing is carried out at a temperature of approximately 1000–1150° C.

4. The method of claim 2, further comprising the step of depositing silicon on said wafer surface after removing said oxide layer, and before annealing said surface.

5. The method of claim 1, wherein said step of removing said oxide layer is carried out by subjecting said wafer to thermal flashing.

6. The method of claim 5, wherein said thermal flashing is carried out using electron bombardment on a backside of said wafer.

7. The method of claim 1, wherein each of said ridges has a width of approximately 1 $\mu$m.

8. The method of claim 7, wherein each of said ridges has a height of approximately 0.5 $\mu$m.

* * * * *

UNITED STATES PATENT AND TRADEMARK OFFICE
CERTIFICATE OF CORRECTION

PATENT NO.  : 5,910,339
DATED       : June 8, 1999
INVENTOR(S) : Jack M. Blakely et al.

It is certified that error appears in the above-indentified patent and that said Letters Patent is hereby corrected as shown below:

Column 1, line 4, after the "Background of invention" heading, the following paragraph should be inserted:

--The present invention arose out of research sponsored by the the National Science Foundation (NSF) under Grant No. DMR-9313371. The Government has certain rights in the invention.--

Signed and Sealed this

Twenty-seventh Day of June, 2000

Attest:

Q. TODD DICKINSON

Attesting Officer

Director of Patents and Trademarks